United States Patent
Lee (10) Patent No.: US 9,672,883 B1
(45) Date of Patent: Jun. 6, 2017

(54) SEMICONDUCTOR CIRCUIT, SERIALIZATION/DESERIALIZATION CIRCUIT, AND DATA PROCESSING SYSTEM RELATING TO CLOCK SIGNALS

(71) Applicant: SK hynix Inc., Icheon-si, Gyeonggi-do (KR)

(72) Inventor: Dong Uk Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/251,146

(22) Filed: Aug. 30, 2016

(30) Foreign Application Priority Data

May 18, 2016 (KR) .................. 10-2016-0061023

(51) Int. Cl.
*G11C 7/22* (2006.01)
*G11C 7/10* (2006.01)
*G11C 8/06* (2006.01)
*G11C 8/18* (2006.01)
*G11C 16/26* (2006.01)

(52) U.S. Cl.
CPC .............. *G11C 7/22* (2013.01); *G11C 7/10* (2013.01); *G11C 8/06* (2013.01); *G11C 8/18* (2013.01); *G11C 16/26* (2013.01)

(58) Field of Classification Search
CPC .................................. G11C 7/22; G11C 16/26
USPC .......................... 365/189.05, 233.5
See application file for complete search history.

(56) References Cited

U.S. PATENT DOCUMENTS

| | | | | |
|---|---|---|---|---|
| 6,459,393 B1* | 10/2002 | Nordman | ............... | H03M 9/00 |
| | | | | 341/100 |
| 6,880,056 B2* | 4/2005 | Kootstra | ............. | G11C 7/1045 |
| | | | | 365/189.04 |
| 7,184,916 B2* | 2/2007 | Resnick | ................ | G11C 29/26 |
| | | | | 702/118 |
| 7,376,767 B1* | 5/2008 | Black | ........................ | G06F 5/06 |
| | | | | 370/466 |
| 7,882,474 B2* | 2/2011 | Wahl | ........................ | G06F 1/12 |
| | | | | 327/141 |
| 7,999,367 B2* | 8/2011 | Kang | ....................... | G11C 5/02 |
| | | | | 257/678 |
| 8,644,378 B2* | 2/2014 | Liu | ........................ | H03K 3/84 |
| | | | | 375/240.03 |
| 8,824,222 B2* | 9/2014 | Ware | ................... | G11C 11/4072 |
| | | | | 365/191 |
| 8,930,740 B2* | 1/2015 | Zerbe | ........................ | G06F 1/08 |
| | | | | 713/500 |
| 9,342,471 B2* | 5/2016 | Miller | ................ | G06F 13/1647 |
| 2004/0139253 A1* | 7/2004 | Perego | ............... | G06F 13/1684 |
| | | | | 710/71 |
| 2014/0133252 A1* | 5/2014 | Ikeda | ..................... | G11C 7/103 |
| | | | | 365/193 |
| 2015/0364170 A1* | 12/2015 | Clovis | ................. | G06F 13/4291 |
| | | | | 365/189.02 |

FOREIGN PATENT DOCUMENTS

KR 1020010084673 A 9/2001

* cited by examiner

*Primary Examiner* — Michael Tran
(74) *Attorney, Agent, or Firm* — William Park & Associates Ltd.

(57) ABSTRACT

A semiconductor circuit may include a control circuit configured to generate a second start signal and a plurality of serialization control signals by synchronizing a first start signal with first and second clock signals.

19 Claims, 8 Drawing Sheets

SEMICONDUCTOR CIRCUIT, SERIALIZATION/DESERIALIZATION CIRCUIT, AND DATA PROCESSING SYSTEM RELATING TO CLOCK SIGNALS

CROSS-REFERENCES TO RELATED APPLICATION

The present application claims priority under 35 U.S.C. §119(a) to Korean application number 10-2016-0061023, filed on May 18, 2016, in the Korean Intellectual Property Office, which is incorporated herein by reference in its entirety.

BACKGROUND

1. Technical Field

Various embodiments may generally relate to a semiconductor circuit, and more particularly, to an SERDES (serialization/deserialization circuit) and a data processing system relating to first and second clock signals.

2. Related Art

For signal input/output of different circuits, an SERDES is required, which converts a parallel signal outputted from any one circuit into a serial signal, and converts a serial signal outputted from another circuit into a parallel signal.

When any one of the different circuits is operated according to a clock signal having a relatively low frequency (for convenience, referred to as a low speed clock), a system must follow the operation speed of the circuit which is operated according to the low speed clock, even though the circuit can be operated according to a clock signal having a high frequency (for convenience, referred to as a high speed clock). In this case, the system is inevitably operated at low speed.

SUMMARY

In an embodiment of the present disclosure, a data processing system may be provided. In an embodiment of the present disclosure, a SERDES may be provided. In an embodiment of the present disclosure, a semiconductor circuit may be provided. The semiconductor circuit may include a control circuit configured to generate a second start signal and a plurality of serialization control signals by synchronizing a first start signal with first and second clock signals.

DETAILED DESCRIPTION

Hereinafter, an SERDES (serialization/deserialization circuit) and a data processing system using the same according to the present disclosure will be described below with reference to the accompanying drawings through examples of embodiments.

Various embodiments may be directed to an SERDES capable of compensating for a frequency difference between operation clocks of different circuits connected to each other, and a data processing system using the same.

Figure 1:
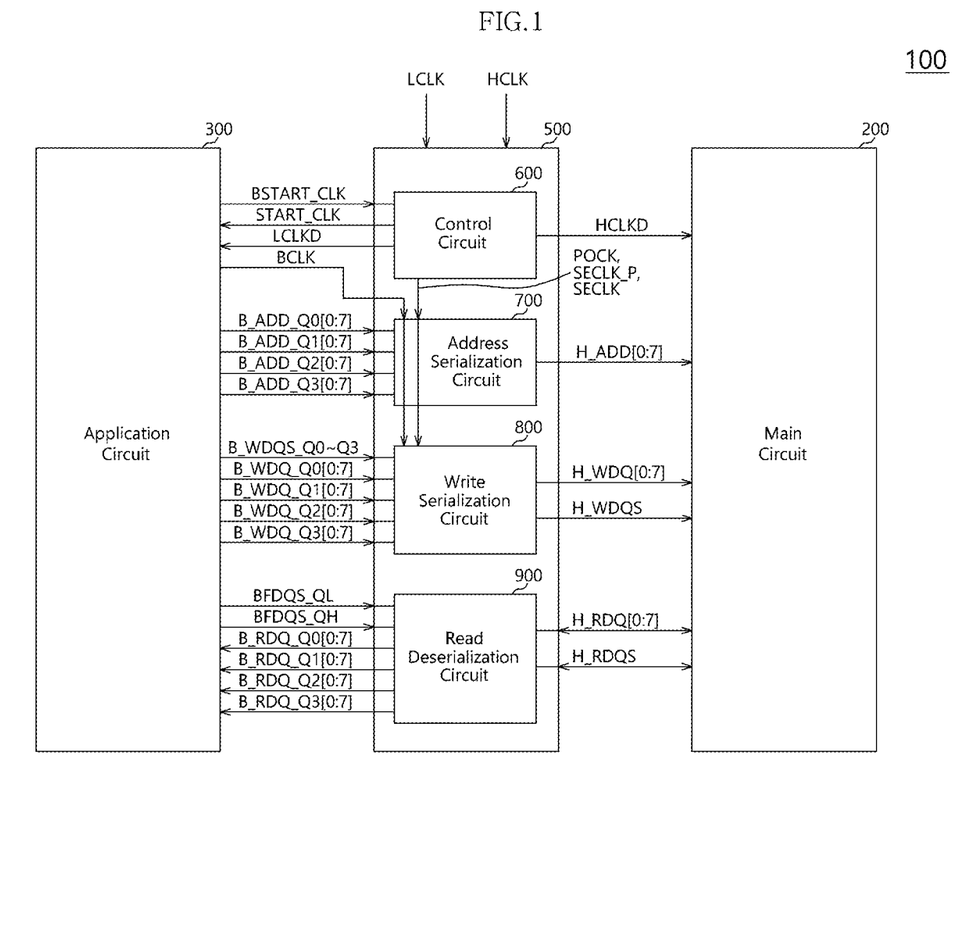
FIG. 1 is a diagram illustrating an example of a representation of the configuration of a data processing system according to an embodiment.

Referring to FIG. 1, a data processing system 100 according to an embodiment may include a main circuit 200, an application circuit 300 and an SERDES 500.

The SERDES 500 may generate a second start signal START_CLK and a plurality of serialization control signals POCLK, SECLK_P and SECLK by synchronizing a first start signal BSTART_CLK outputted from the application circuit 300 with first and second clock signals LCLK and HCLK.

The SERDES 500 may generate serial write data H_WDQ<0:7> and a serial address H_ADD<0:7> by serializing parallel addresses B_ADD_Q<0:3><0:7> and parallel write data B_WDQ_Q<0:3><0:7> which are outputted from the application circuit 300, according to a feedback clock signal BCLK and the plurality of serialization control signals POCLK, SECLK_P and SECLK, and provide the serial write data H_WDQ<0:7> and the serial address H_ADD<0:7> to the main circuit 200.

The second clock signal HCLK may include a high speed clock or a clock signal having a higher frequency than the first clock signal LCLK.

The SERDES 500 may generate a serial write strobe signal H_WDQS by serializing parallel write strobe signals B_WDQS_Q<0:3> outputted from the application circuit 300 according to the plurality of serialization control signals POCLK, SECLK_P and SECLK, and provide the serial write strobe signal H_WDQS to the main circuit 200.

The SERDES 500 may generate parallel read data B_RDQ_Q<0:3><0:7> by deserializing serial read data H_RDQ<0:7> outputted from the main circuit 200 according to a serial read strobe signal H_RDQS outputted from the main circuit 200 and parallel read strobe signals BFDQS_QL and BFDQS_QH outputted from the application circuit 300, and provide the parallel read data B_RDQ_Q<0:3><0:7> to the application circuit 300.

The SERDES 500 may provide a first compensation clock signal LCLKD and a second compensation clock signal HCLKD to the application circuit 300 and main circuit 200.

The SERDES 500 may include a control circuit 600, an address serialization circuit 700, a write serialization circuit 800 and a read deserialization circuit 900.

The control circuit 600 may generate the second start signal START_CLK and the plurality of serialization control signals POCLK, SECLK_P and SECLK by synchronizing the first start signal BSTART_CLK with the first clock signal LCKL and the second clock signal HCLK.

The address serialization circuit 700 may generate the serial address H_ADD<0:7> by sorting the parallel addresses B_ADD_Q<0:3><0:7> according to the feedback clock signal BCLK and the plurality of serialization control signals POCLK, SECLK_P and SECLK.

The write serialization circuit 800 may generate the serial write data H_WDQ<0:7> and the serial write strobe signal H_WDQS by sorting the parallel write data B_WDQ_Q<0:3><0:7> and the parallel write strobe signals B_WDQS_Q<0:3> according to the feedback clock signal BCLK and the plurality of serialization control signals POCLK, SECLK_P and SECLK.

The read deserialization circuit 900 may generate deserialized signals by deserializing the serial read data H_RDQ according to the serial read strobe signal H_RDQS, and output the deserialized signals as the parallel read data B_RDQ_Q<0:3> according to the parallel read strobe signals BFDQS_QL and BFDQS_QH.

The application circuit 300 may serve to perform an application operation related to the main circuit 200, and include an MBIST (Memory Built In Self Test) which is included in a memory package and can perform a memory test itself without an external tester.

The application circuit 300 may be operated according to the first compensation clock signal LCLKD.

The application circuit 300 may provide the first start signal BSTART_CLK, the feedback clock signal BCLK, the parallel read strobe signals BFDQS_QL and BFDQS_QH, the parallel addresses B_ADD_Q<0:3><0:7>, the parallel write strobe signals B_WDQS_Q<0:3> and the parallel write data B_WDQ_Q<0:3><0:7> to the SERDES 500.

The application circuit 300 may provide a read command and a write command to the main circuit 200, using the parallel addresses B_ADD_Q<0:3><0:7>.

The read command and the write command which are included in the parallel addresses B_ADD_Q<0:3><0:7> may be included in the serial address H_ADD<0:7> converted through the SERDES 500, and then transmitted to the main circuit 200.

The application circuit 300 may delay the first compensation clock signal LCKLD by an internal circuit delay time based on the second start signal START_CLK, and provide the delayed signal as the feedback clock signal BCLK to the SERDES 500.

The feedback clock signal BCLK may be generated in the application circuit 300, based on the second start signal START_CLK which is generated in synchronization with the first clock signal LCLK.

Therefore, the SERDES 500 can recognize the internal circuit delay time of the application circuit 300 according to the feedback clock signal BCLK.

The main circuit 200 may include a memory circuit.

The main circuit 200 may be operated according to the second compensation clock signal HCLKD.

When a read command is inputted, the main circuit 200 may provide the serial read strobe signal H_RDQS and the serial read data H_RDQ<0:7> corresponding to the serial address H_ADD<0:7> to the SERDES 500.

When a write command is inputted, the main circuit 200 may write the serial write data H_WDQ<0:7> to a memory area corresponding to the serial address H_ADD<0:7> according to the serial write strobe signal H_WDQS.

Figure 2:
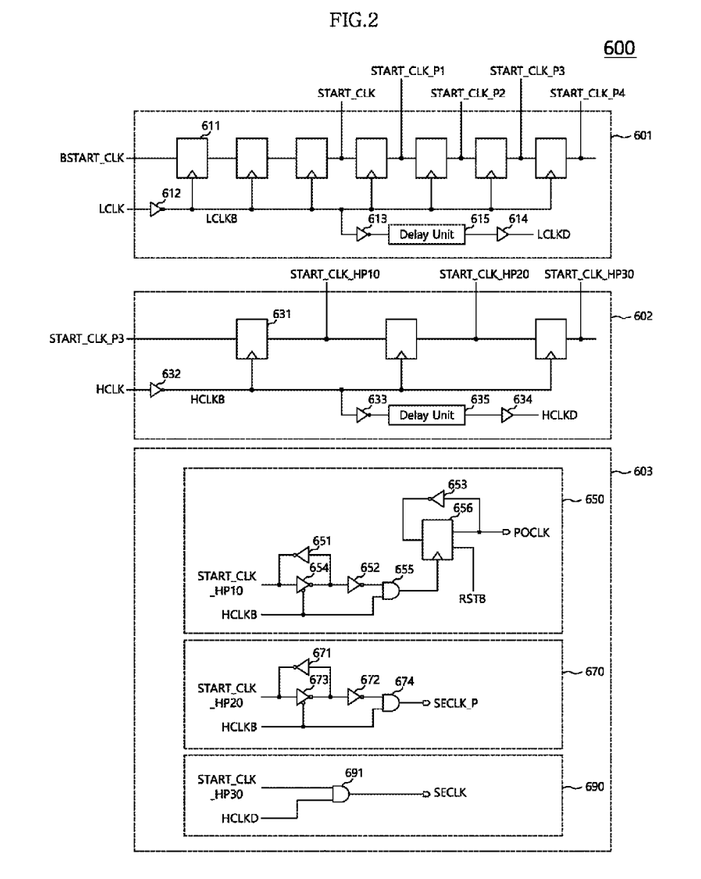
FIG. 2 is a diagram illustrating an example of a representation of the configuration of a control circuit of FIG. 1.

Referring to FIG. 2, the control circuit 600 may include a first clock synchronization block 601, a second clock synchronization block 602 and a serialization control signal generation block 603.

The first clock synchronization block 601 may generate first preliminary signals START_CLK_P1 to START_CLK_P4 including the second start signal START_CLK by synchronizing the first start signal BSTART_CLK with the first clock signal LCLK. The first preliminary signals may include the second start signal START_CLK, The first clock synchronization block 601 may generate the first compensation clock signal LCLKD by delaying the first clock signal LCLK by a first compensation time.

The first compensation clock signal LCLKD may be obtained by delaying the first clock signal LCLK by the first compensation time corresponding to a difference between the operation timing of the application circuit 300 and the point of time that the first start signal BSTART_CLK is activated.

The first clock synchronization block 601 may include a plurality of flip-flops 611, a plurality of inverters 612 to 614, and a delay unit 615.

The inverter 613 may receive the first clock signal LCKL and output the inverted first clock signal LCKLB.

The plurality of flip-flops 611 may generate the first preliminary signals START_CLK and START_CLK_P1 to START_CLK_P4 by sequentially shifting the first start signal BSTART_CLK according to the inverted first clock signal LCLKB.

The inverted first clock signal LCLKB may be delayed by the first compensation time through the inverters 613 and 614 and the delay unit 615, and outputted as the first compensation clock signal LCLKD.

The second clock synchronization block 602 may generate second preliminary signals START_CLK_HP10 to START_CLK_HP30 by synchronizing any one of the first preliminary signals START_CLK and START_CLK_P1 to START_CLK_P4 with the second clock signal HCLK. At this time, the synchronized first preliminary signal may coincide with target timing.

The second clock synchronization block 602 may generate the second compensation clock signal HCLKD by delaying the second clock signal HCLK by a second compensation time.

The second compensation clock signal HCLKD may be obtained by delaying the second clock signal HCLK by the second compensation time corresponding to a difference between the operation timing of the main circuit 200 and the point of time that the first start signal BSTART_CLK is activated.

The second clock synchronization block 602 may include a plurality of flip-flops 631, a plurality of inverters 632 to 634, and a delay unit 635.

The inverter 632 may receive the second clock signal HCKL and output the inverted second clock signal HCKLB.

The plurality of flip-flops 631 may generate the second preliminary signals START_CLK_HP10 to START_CLK_HP30 by sequentially shifting the first preliminary signal START_CLK_P3 according to the inverted second clock signal HCLKB.

The inverted second clock signal HCLKB may be delayed by the second compensation time through the inverters 633 and 634 and the delay unit 635, and outputted as the second compensation clock signal HCLKD.

The serialization control signal generation block 603 may generate the plurality of serialization control signals POCLK, SECLK_P and SECLK, using the second preliminary signals START_CLK_HP10 to START_CLK_HP30, the inverted second clock signal HCLKB and the second compensation clock signal HCLKD.

The serialization control signal generation block 603 may include first to third signal generation blocks 650, 670 and 690.

The first signal generation block 650 may generate the serialization control signal POCLK among the plurality of serialization control signals POCLK, SECLK_P and SECLK, according to the second preliminary signal START_CLK_HP10 at the earliest timing among the second preliminary signals START_CLK_HP10 to START_CLK_HP30, the inverted second clock signal HCLKB and a reset signal RSTB.

The first signal generation block 650 may include a plurality of inverters 651 to 653, a tri-state inverter 654, an AND gate 655 and a flip-flop 656.

The flip-flop 656 may receive an output value, which is reset according to the reset signal RSTB, through the inverter 653.

The tri-state inverter 654 may latch the second preliminary signal START_CLK_HP10 when the inverted second clock signal HCLKB is at a logic low level.

The AND gate 655 may provide an output of the inverter 652 to a clock terminal of the flip-flop 656 when the inverted second clock signal HCLKB transitions to a logic high level.

The flip-flop 656 may generate the serialization control signal POCLK which transitions at the same cycle as the first clock signal LCLK, according to the output of the AND gate 655.

The second signal generation block 670 may generate the serialization control signal SECLK_P among the plurality of serialization control signals POCLK, SELCK_P and SECLK, according to the inverted second clock signal HCLKB and the second preliminary signal START_CLK_HP20 at the next timing of the second preliminary signal START_CLK_HP10.

The second signal generation block 670 may include a plurality of inverters 671 and 672, a tri-state inverter 673 and an AND gate 674.

The tri-state inverter 673 may latch the second preliminary signal START_CLK_HP10 when the inverted second clock signal HCLKB is at a logic low level.

The AND gate 674 may provide an output of the inverter 672 as the serialization control signal SECLK_P when the inverted second clock signal HCLKB transitions to a logic high level.

The serialization control signal SECLK_P may transition at the same cycle as the second clock signal HCLK.

The third signal generation block 690 may include an AND gate 691 which performs an AND operation on the second compensation clock signal HCLKD and the second preliminary signal START_CLK_HP30 at the next timing of the second preliminary signal START_CLK_HP20, and outputs the operation result as the serialization control signal SECLK.

The serialization control signal SECLK may transition at the same cycle as the second clock signal HCLK.

The internal circuit configuration of the application circuit 300 may include one or more circuit configurations related to generation of the parallel addresses B_ADD_Q<0:3><0:7>.

Figure 3:
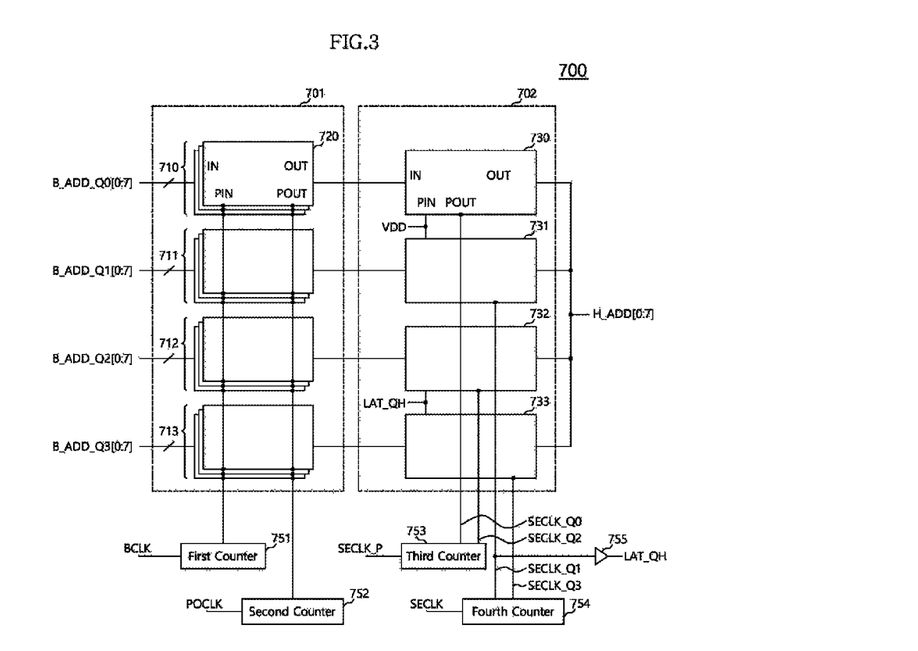
FIG. 3 is a diagram illustrating an example of a representation of the configuration of an address serialization circuit of FIG. 1.

Referring to FIG. 3, the address serialization circuit 700 may include a pipe latch array 701, a serializer array 702 and first to fourth counters 751 to 754.

The pipe latch array 701 may include first to fourth pipe latch groups 710 to 713.

The first pipe latch group 710 may latch the parallel address B_ADD_Q0<0:7> according to an input control signal PIN, and output the latched signal according to an output control signal POUT.

The second pipe latch group 711 may latch the parallel address B_ADD_Q1<0:7> according to the input control signal PIN, and output the latched signal according to the output control signal POUT.

The third pipe latch group 712 may latch the parallel address B_ADD_Q2<0:7> according to the input control signal PIN, and output the latched signal according to the output control signal POUT.

The fourth pipe latch group 713 may latch the parallel address B_ADD_Q3<0:7> according to the input control signal PIN, and output the latched signal according to the output control signal POUT.

The serializer array 702 may include first to fourth serializers 730 to 733.

The first serializer 730 may latch the output of the first pipe latch group 710 according to the input control signal PIN, and output the latched signal as the serial address H_ADD<0:7> according to the output control signal POUT.

The second serializer 731 may latch the output of the second pipe latch group 711 according to the input control signal PIN, and output the latched signal as the serial address H_ADD<0:7> according to the output control signal POUT.

The third serializer 732 may latch the output of the third pipe latch group 712 according to the input control signal PIN, and output the latched signal as the serial address H_ADD<0:7> according to the output control signal POUT.

The fourth serializer 733 may latch the output of the fourth pipe latch group 713 according to the input control signal PIN, and output the latched signal as the serial address H_ADD<0:7> according to the output control signal POUT.

The first counter 751 may provide a counting signal obtained by counting the feedback clock signal BCLK as the input control signal PIN to the pipe latch array 701.

The second counter 752 may provide a counting signal, which is obtained by counting the serialization control signal POCLK among the plurality of serialization control signals POCLK, SECLK_P and SECLK, as the output control signal POUT to the pipe latch array 701.

The third counter 753 may provide counting signals SECLK_Q0 and SECLK_Q2, which are obtained by counting the serialization control signal SECLK_P among the plurality of serialization control signals POCLK, SECLK_P and SECLK, as the output control signal POUT to the first and third serializers 730 and 732, respectively.

The fourth counter 754 may provide counting signals SECLK_Q1 and SECLK_Q3, which are obtained by counting the serialization control signal SECLK among the plurality of serialization control signals POCLK, SECLK_P and SECLK, as the output control signal POUT to the second and fourth serializers 731 and 733, respectively.

The address serialization circuit 700 may further include a buffer 755.

The buffer 755 may receive the counting signal SECLK_Q1, and generate an output signal LAT_QH.

In an embodiment, a supply voltage level VDD may be provided as the input control signal PIN of the first and second serializers 730 and 731.

The output signal LAT_QH of the buffer 755 may be provided as the input control signal PIN of the third and fourth serializers 732 and 733.

Figure 4:
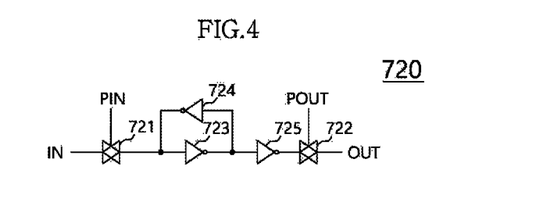
FIG. 4 is a diagram illustrating an example of a representation of the configuration of a pipe latch of FIG. 3.

Referring to FIGS. 3 and 4, the pipe latch 720 may include first and second switches 721 and 722 and latches 723 to 725.

The first switch 721 may transmit an input signal IN to the latches 723 to 725 according to the input control signal PIN.

The second switch 722 may output signals stored in the latches 723 to 725 according to the output control signal POUT.

Figure 5:
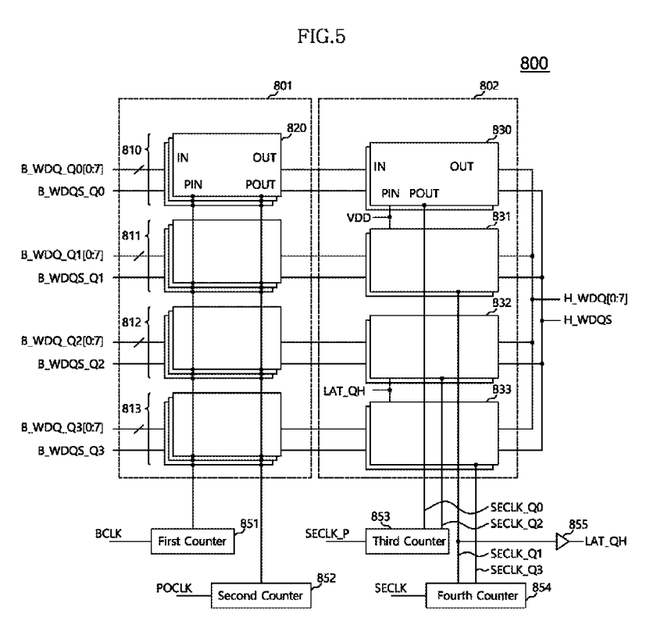
FIG. 5 is a diagram illustrating an example of a representation of the configuration of a write serialization circuit of FIG. 1.

Referring to FIG. 5, the write serialization circuit 800 may include a pipe latch array 801, a serializer array 802 and first to fourth counters 851 to 854.

The pipe latch array 801 may include first to fourth pipe latch groups 810 to 813.

The first pipe latch group 810 may latch the parallel write data B_WDQ_Q0<0:7> and the parallel write strobe signal B_WDQS_Q0 according to the input control signal PIN, and output the latched signals according to the output control signal POUT.

The second pipe latch group 811 may latch the parallel write data B_WDQ_Q1<0:7> and the parallel write strobe signal B_WDQS_Q1 according to the input control signal PIN, and output the latched signals according to the output control signal POUT.

The third pipe latch group 812 may latch the parallel write data B_WDQ_Q2<0:7> and the parallel write strobe signal B_WDQS_Q2 according to the input control signal PIN, and output the latched signals according to the output control signal POUT.

The fourth pipe latch group 813 may latch the parallel write data B_WDQ_Q3<0:7> and the parallel write strobe signal B_WDQS_Q3 according to the input control signal PIN, and output the latched signals according to the output control signal POUT.

The serializer array 802 may include first to fourth serializer sets 830 to 833.

The first serializer set 830 may latch the output signals of the first pipe latch group 810 according to the input control signal PIN, and output the latched signals as the serial write data H_WDQ<0:7> and the serial write strobe signal H_WDQS according to the output control signal POUT.

The second serializer set 831 may latch the output signals of the second pipe latch group 811 according to the input control signal PIN, and output the latched signals as the serial write data H_WDQ<0:7> and the serial write strobe signal H_WDQS according to the output control signal POUT.

The third serializer set 832 may latch the output signals of the third pipe latch group 812 according to the input control signal PIN, and output the latched signals as the serial write data H_WDQ<0:7> and the serial write strobe signal H_WDQS according to the output control signal POUT.

The fourth serializer set 833 may latch the output signals of the fourth pipe latch group 813 according to the input control signal PIN, and output the latched signals as the serial write data H_WDQ<0:7> and the serial write strobe signal H_WDQS according to the output control signal POUT.

The first counter 851 may provide a counting signal obtained by counting the feedback clock signal BCLK as the input control signal PIN to the pipe latch array 801.

The second counter 852 may provide a counting signal, which is obtained by counting the serialization control signal POCLK among the plurality of serialization control signals POCLK, SECLK_P and SECLK, as the output control signal POUT to the pipe latch array 801.

The third counter 853 may provide counting signals SECLK_Q0 and SECLK_Q2, which are obtained by counting the serialization control signal SECLK_P among the plurality of serialization control signals POCLK, SECLK_P and SECLK, as the output control signal POUT to the first and third serializer sets 830 and 832, respectively.

The fourth counter 854 may provide counting signals SECLK_Q1 and SECLK_Q3, which are obtained by counting the serialization control signal SECLK among the plurality of serialization control signals POCLK, SECLK_P and SECLK, as the output control signal POUT to the second and fourth serializer sets 831 and 833, respectively.

The write serialization circuit 800 may further include a buffer 855.

The buffer 855 may receive the counting signal SECLK_Q1, and generate an output signal LAT_QH.

The supply voltage level VDD may be provided as the input control signal PIN of the first and second serializer sets 830 and 831.

The output signal LAT_QH of the buffer 855 may be provided as the input control signal PIN of the first and second serializer sets 832 and 831.

The pipe latch 820 of FIG. 5 may be configured in the same manner as FIG. 4.

Figure 6:
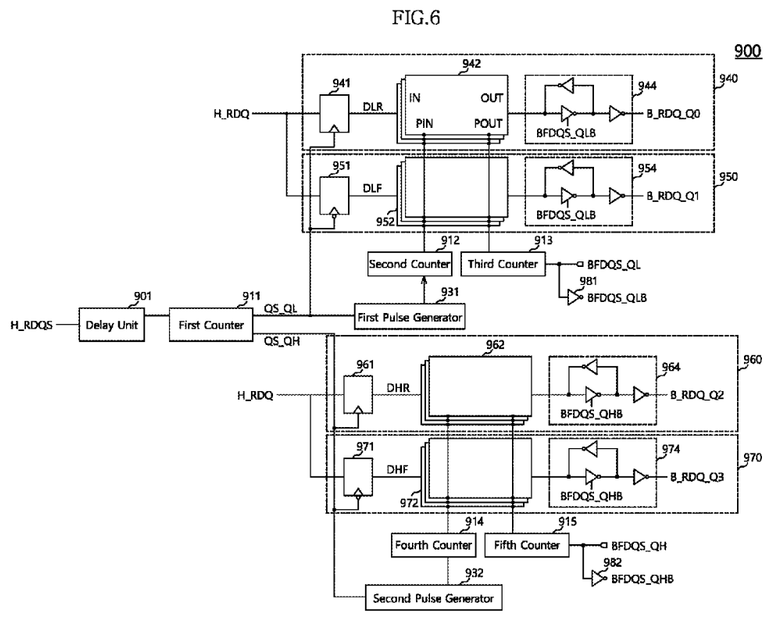
FIG. 6 is a diagram illustrating an example of a representation of the configuration of a read deserialization circuit of FIG. 1.

Referring to FIG. 6, the read deserialization circuit 900 may include a delay unit 901, first to fifth counters 911 to 915, first and second pulse generators 931 and 932, first to fourth deserializers 940 and 970 and first and second inverters 961 and 962.

The delay unit 901 may delay the serial read strobe signal H_RDQS.

The first counter 911 may generate first and second counting signals QS_QL and QS_QH by counting the output of the delay unit 901.

The first counting signal QS_QL and the second counting signal QS_QH may correspond to an even-numbered pulse and an odd-numbered pulse of the serial read strobe signal H_RDQS, respectively.

The first pulse generator 931 may generate a pulse signal according to the first counting signal QS_QL.

The second counter 912 may provide a counting signal, which is obtained by counting the pulse signal generated through the first pulse generator 931, as the input control signal PIN to the first and second deserializers 940 and 950.

The third counter 913 may provide a counting signal, which is obtained by counting the parallel read strobe signal BFDQS_QL of the parallel read strobe signals BFDQS_QL and BFDQS_QH, as the output control signal POUT to the first and second deserializers 940 and 950.

The first inverter 981 may invert the parallel read strobe signal BFDQS_QL, and output the inverted parallel read strobe signal BFDQS_QLB.

The second pulse generator 932 may generate a pulse signal according to the second counting signal QS_QH.

The fourth counter 914 may provide a counting signal which is obtained by counting the pulse signal generated through the second pulse generator 932, as the input control signal PIN to the third and fourth deserializers 960 and 970.

The fifth counter 915 may provide a counting signal, which is obtained by counting the parallel read strobe signal BFDQS_QH of the parallel read strobe signals BFDQS_QL and BFDQS_QH, as the output control signal POUT to the third and fourth deserializers 960 and 970.

The second inverter 982 may invert the parallel read strobe signal BFDQS_QH, and output the inverted parallel read strobe signal BFDQS_QHB.

The first deserializer 940 may include a flip-flop 941, a pipe latch group 942 and a latch 944.

The flip-flop 941 may generate an output signal DLR by latching the serial read data H_RDQ according to the first counting signal QS_QL.

The pipe latch group 942 may deserialize the output signal DLR of the flip-flop 941 according to the input control signal PIN outputted from the second counter 912 and the output control signal POUT outputted from the third counter 913.

The latch 944 may output the output of the pipe latch group 942 as the parallel read data B_RDQ_Q0 according to the inverted parallel read strobe signal BFDQS_QLB outputted from the first inverter 981.

The second deserializer 950 may include a flip-flop 951, a pipe latch group 952 and a latch 954.

The flip-flop 951 may generate an output signal DLF by latching the serial read data H_RDQ according to an inverted signal of the first counting signal QS_QL.

The pipe latch group 952 may deserialize the output signal DLF of the flip-flop 951 according to the input control signal PIN outputted from the second counter 912 and the output control signal POUT outputted from the third counter 913.

The latch 954 may output the output of the pipe latch group 952 as the parallel read data B_RDQ_Q1 according to the inverted parallel read strobe signal BFDQS_QLB outputted from the first inverter 981.

The third deserializer 960 may include a flip-flop 961, a pipe latch group 962 and a latch 964.

The flip-flop 961 may generate an output signal DHR by latching the serial read data H_RDQ according to the second counting signal QS_QH.

The pipe latch group 962 may deserialize the output signal DHR of the flip-flop 961 according to the input control signal PIN outputted from the fourth counter 914 and the output control signal POUT outputted from the fifth counter 915.

The latch 964 may output the output of the pipe latch group 962 as the parallel read data B_RDQ_Q2 according to the inverted parallel read strobe signal BFDQS_QHB outputted from the second inverter 982.

The fourth deserializer 970 may include a flip-flop 971, a pipe latch group 972 and a latch 974.

The flip-flop 971 may generate an output signal DHF by latching the serial read data H_RDQ according to an inverted signal of the second counting signal QS_QH.

The pipe latch group 972 may deserialize the output signal DHF of the flip-flop 971 according to the input control signal PIN outputted from the fourth counter 914 and the output control signal POUT outputted from the fifth counter 915.

The latch 974 may output the output of the pipe latch group 972 as the parallel read data B_RDQ_Q3 according to the inverted parallel read strobe signal BFDQS_QHB outputted from the second inverter 982.

The pipe latch group 942 of FIG. 6 may include pipe latches configured in the same manner as FIG. 4.

Hereafter, the operation of a present embodiment will be described with reference to FIGS. 7 to 9.

Figure 7:
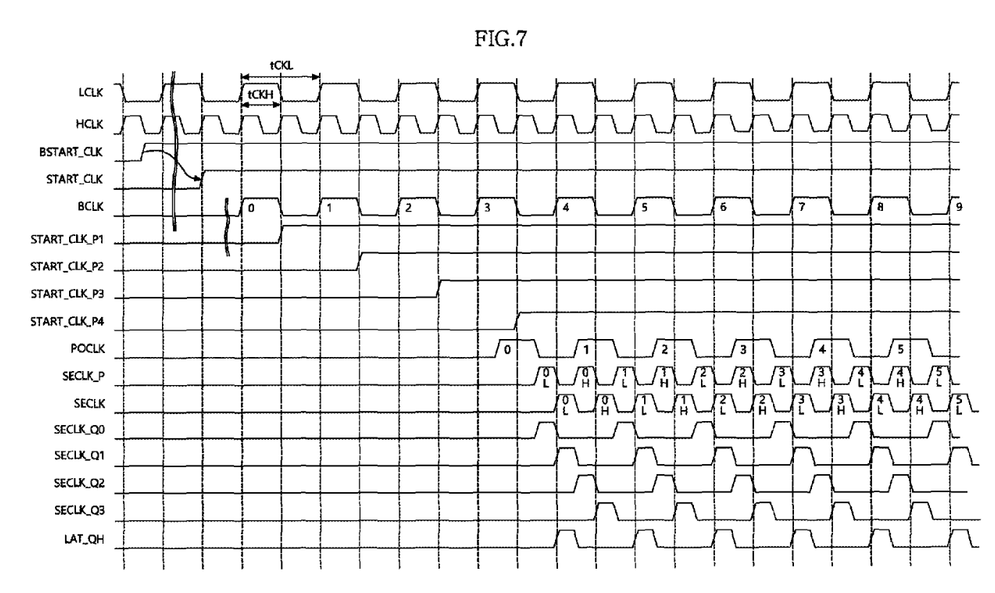
FIGS. 7 and 8 are operation timing diagrams of a control circuit of FIG. 2, an address serialization circuit of FIG. 3 and a write serialization circuit of FIG. 5.

Referring to FIG. 7, the application circuit 300 may provide the first start signal BSTART_CLK.

The control circuit 600 of FIG. 2 may generate the second start signal START_CLK and the first preliminary signals START_CLK_P1 to START_CLK_P4 by synchronizing the first start signal BSTART_CLK with the first clock signal LCKL and the second clock signal HCLK.

The first clock signal LCLK may have a cycle corresponding to tCKL, and the second clock signal HCLK may have a cycle corresponding to tCKH which is the half of tCKL. That is, the frequency of the second clock signal HCLK may correspond to the double of the frequency of the first clock signal LCLK.

The control circuit 600 of FIG. 2 may generate the plurality of serialization control signals POCLK, SECLK_P and SECLK according to the first preliminary signals START_CLK and START_CLK_P1 to START_CLK_P4.

The serialization control signal SECLK_P may transition at the same cycle as the second clock signal HCLK. The serialization control signal SECLK may transition at the same cycle as the second clock signal HCLK.

The address serialization circuit 700 of FIG. 3 and the write serialization circuit 800 of FIG. 5 may generate the counting signals SECLK_Q0 to SECLK_Q3 by counting the plurality of serialization control signals POCLK, SECLK_P and SECLK.

Any one of the counting signals SECLK_Q0 to SECLK_Q3, for example, the counting signal SECLK_Q0 may be buffered and outputted as the output signal LAT_QH.

Figure 8:
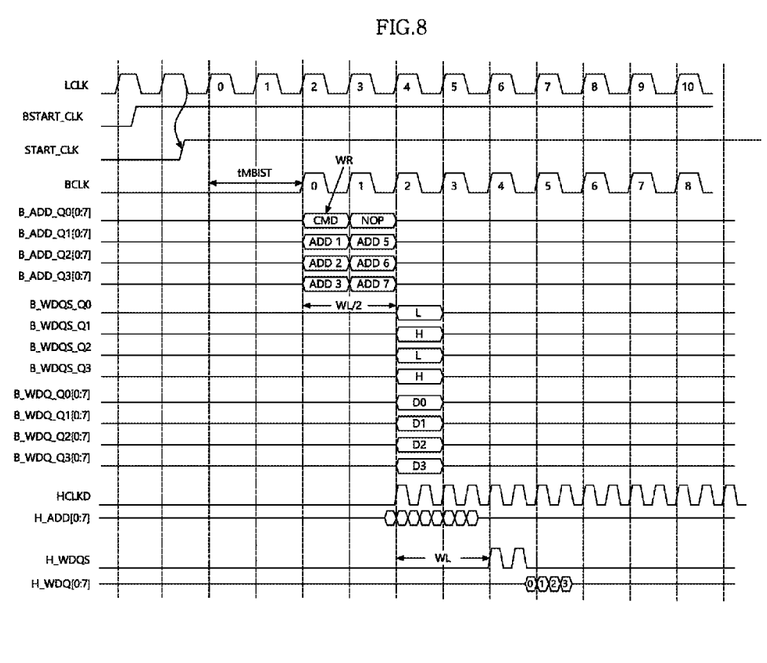

Referring to FIG. 8, the address serialization circuit 700 of FIG. 3 and the write serialization circuit 800 of FIG. 5 may serialize the parallel addresses B_ADD_Q<0:3><0:7>, the parallel write data B_WDQ_Q<0:3><0:7> and the parallel write strobe signals B_WDQS_Q<0:3> according to signals obtained by counting the feedback clock signal BCLK and the serialization control signals POCLK, SECLK_P and SECLK, and output the serialized address, data and signal as the serial address H_ADD<0:7>, the serial write data H_WDQ<0:7> and the serial write strobe signal H_WDQS.

The parallel address B_ADD_Q0<0:7> may include a command CMD, for example, a write command WR, instead of address information ADD0.

The other parallel addresses B_ADD_Q<1:3><0:7> may include actual address information ADD1, ADD2, ADD3, ADD5, ADD6 and ADD7.

The parallel write strobe signals B_WDQS_Q<0:3> may be generated with a timing difference corresponding to WL/2 from the parallel addresses B_ADD_Q<0:3><0:7>. WL may represent write latency.

Figure 9:
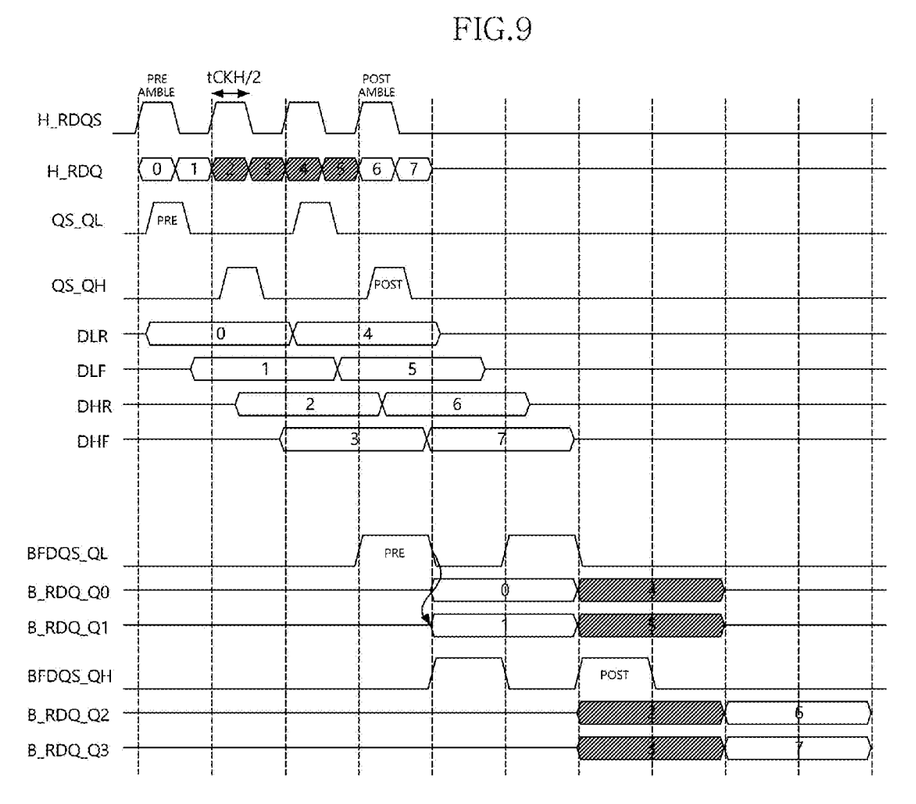
FIG. 9 is an operation timing diagram of a read deserialization circuit of FIG. 6.

Referring to FIG. 9, 8-bit serial read data H_RDQ may be sequentially inputted from the main circuit 200.

At this time, the serial read strobe signal H_RDQS may be inputted with the serial read data H_RDQ. The serial read strobe signal H_RDQS may include a pre amble and a post amble.

The read deserialization circuit 900 of FIG. 6 may generate the output signals DLR, DLF, DHR and DHF by latching the serial read data H_RDQ according to the first and second counting signals QS_QL and QS_QH obtained by counting the serial read strobe signal H_RDQS.

The read deserialization circuit 900 of FIG. 6 may deserialize the output signals DLR, DLF, DHR and DHF according to the parallel read strobe signals BFDQS_QL and BFDQS_QH provided from the application circuit 300, and output the deserialized signals as the parallel read data B_RDQ_Q<0:3>.

While certain embodiments have been described above, it will be understood to those skilled in the art that the embodiments described are by way of example only. Accordingly, the semiconductor circuit described herein should not be limited based on the described embodiments. Rather, the semiconductor circuit described herein should only be limited in light of the claims that follow when taken in conjunction with the above description and accompanying drawings.

What is claimed is:

1. A serialization/deserialization circuit (SERDES) comprising:
   a control circuit configured to generate a second start signal and a plurality of serialization control signals by synchronizing a first start signal with first and second clock signals;

an address serialization circuit configured to generate a serial address by sorting a parallel address according to a feedback clock signal and the plurality of serialization control signals;

a write serialization circuit configured to generate serial write data by sorting parallel write data according to the feedback clock signal and the plurality of serialization control signals; and a read deserialization circuit configured to deserialize serial read data and output the deserialized data as parallel read data.

2. The SERDES according to claim 1, wherein the second clock signal has a higher frequency than the first clock signal.

3. The SERDES according to claim 1, wherein the first start signal is provided from an external circuit, and the second start signal is provided to the external circuit.

4. The SERDES according to claim 1, wherein the feedback clock signal comprises a signal obtained by delaying a first compensation clock signal through an external circuit, the first compensation clock signal being generated by delaying the first clock signal by a first time.

5. The SERDES according to claim 1, wherein the write serialization circuit generates a serial write strobe signal by sorting a parallel write strobe signal according to the feedback clock signal and the plurality of serialization control signals.

6. The SERDES according to claim 1, wherein the read deserialization circuit generates a deserialized signal by deserializing the serial read data according to a serial read strobe signal, and outputs the deserialized signal as the parallel read data according to a parallel read strobe signal.

7. The SERDES according to claim 6, wherein the serial data and the serial read strobe signal are provided from a first external circuit, and the parallel read strobe signal is provided from a second external circuit.

8. The SERDES according to claim 1, wherein the control circuit comprises:

a first clock synchronization block configured to generate first preliminary signals including the second start signal by synchronizing the first start signal with the first clock signal;

a second clock synchronization block configured to generate second preliminary signals by synchronizing any one of the first preliminary signals with the second clock signal; and a serialization control signal generation block configured to generate the plurality of serialization control signals using the second preliminary signals and an inverted second clock signal.

9. The SERDES according to claim 1, wherein the address serialization circuit comprises:

a pipe latch array configured to latch the parallel address according to a first input control signal, and output the latched signal according to a first output control signal;

a serializer array configured to latch the output of the pipe latch array according to a second input control signal, and output the latched signal as the serial address according to a second output control signal; and a plurality of counters configured to generate the first input control signal, the second input signal, the first output control signal and the second output control signal by counting the feedback clock signal and the plurality of serialization control signals.

10. The SERDES according to claim 1, wherein the write serialization circuit comprises:

a pipe latch array configured to latch a parallel write strobe signal and the parallel write data according to a first input control signal, and output the latched signals according to a first output control signal;

a serializer array configured to latch the output signals of the pipe latch array according to a second input control signal, and output the latched signals as a serial write strobe signal and the serial write data according to a second output control signal; and a plurality of counters configured to generate the first input control signal, the second input signal, the first output control signal and the second output control signal by counting the feedback clock signal and the plurality of serialization control signals.

11. The SERDES according to claim 1, wherein the read deserialization circuit comprises:

a plurality of counters configured to generate first and second counting signals by counting a serial read strobe signal, and generate a plurality of input control signals and a plurality of output control signals using the first and second counting signals and a parallel read strobe signal; and a plurality of deserializers configured to generate a deserialized signal by deserializing serial read data according to the first or second counting signal, the plurality of input control signals and the plurality of output control signals, and output the deserialized signal as the parallel read data according to the parallel read strobe signals.

12. The SERDES according to claim 11, wherein the first counting signal corresponds to an even-numbered pulse of the serial read strobe signal, and the second counting signal corresponds to an odd-numbered pulse of the serial read strobe signal.

13. A data processing system comprising:

a main circuit;

an application circuit configured to output a first start signal and a feedback clock signal generated according to a second start signal, and perform an application operation related to the main circuit; and a serialization/deserialization circuit (SERDES) configured to generate the second start signal and a plurality of serialization control signals by synchronizing the first start signal with first and second clock signals, serialize an address and data outputted from the application circuit according to the plurality of serialization control signals, and provide the serialized address and data to the main circuit, wherein the application circuit is operated according to a first compensation clock signal, and the main circuit is operated according to a second compensation clock signal.

14. The data processing system according to claim 13, wherein the SERDES generates the first compensation clock signal by delaying the first clock signal by a first time, and generates the second compensation clock signal by delaying the second clock signal by a second time.

15. The data processing system according to claim 13, wherein the SERDES comprises:

a control circuit configured to generate the second start signal and the plurality of serialization control signals by synchronizing the first start signal with the first and second clock signals;

an address serialization circuit configured to generate a serial address by sorting a parallel address according to the feedback clock signal and the plurality of serialization control signals;

a write serialization circuit configured to generate serial write data by sorting parallel write data according to the feedback clock signal and the plurality of serialization control signals; and a read deserialization circuit configured to deserialize serial read data and output the deserialized data as parallel read data.

16. The data processing system according to claim 15, wherein the write serialization circuit generates a serial write strobe signal by sorting a parallel write strobe signal according to the feedback clock signal and the plurality of serialization control signals.

17. The data processing system according to claim 15, wherein the read deserialization circuit generates a deserialized signal by deserializing the serial read data according to a serial read strobe signal, and outputs the deserialized signal as the parallel read data according to a parallel read strobe signal.

18. The data processing system according to claim 15, wherein the control circuit comprises:

a first clock synchronization block configured to generate first preliminary signals including the second start signal by synchronizing the first start signal with the first clock signal;

a second clock synchronization block configured to generate second preliminary signals by synchronizing any one of the first preliminary signals with the second clock signal; and a serialization control signal generation block configured to generate the plurality of serialization control signals using the second preliminary signals and an inverted second clock signal.

19. The data processing system according to claim 15, wherein the address serialization circuit comprises:

a pipe latch array configured to latch the parallel address according to a first input control signal, and output the latched signal according to a first output control signal;

a serializer array configured to latch the output of the pipe latch array according to a second input control signal, and output the latched signal as the serial address according to a second output control signal; and a plurality of counters configured to generate the first input control signal, the second input signal, the first output control signal and the second output control signal by counting the feedback clock signal and the plurality of serialization control signals.

* * * * *